United States Patent
Sales Casals et al.

(10) Patent No.: US 9,276,399 B2
(45) Date of Patent: Mar. 1, 2016

(54) METHOD AND SYSTEM FOR MONITORING A CABLE SYSTEM OF AN ELECTRIC POWER TRANSMISSION SYSTEM

(75) Inventors: Lluis-Ramon Sales Casals, Milan (IT); Joaquin Del Rio Fernández, Vilanova i la Geltru (ES); Rafael Lara, Vilanova i la Geltru (ES); Antonio Manuel Lazaro, Vilanova i la Geltru (ES)

(73) Assignee: PRYSMIAN S.P.A., Milan (IT)

( * ) Notice: Subject to any disclaimer, the term of this patent is extended or adjusted under 35 U.S.C. 154(b) by 892 days.

(21) Appl. No.: 13/387,428

(22) PCT Filed: Jul. 30, 2009

(86) PCT No.: PCT/EP2009/005520
§ 371 (c)(1),
(2), (4) Date: Apr. 12, 2012

(87) PCT Pub. No.: WO2011/012146
PCT Pub. Date: Feb. 3, 2011

(65) Prior Publication Data
US 2012/0188095 A1     Jul. 26, 2012

(51) Int. Cl.
*G08C 15/06* (2006.01)
*H02H 7/26* (2006.01)
(Continued)

(52) U.S. Cl.
CPC .............. *H02H 7/263* (2013.01); *H04Q 9/00* (2013.01); *G01R 31/083* (2013.01);
(Continued)

(58) Field of Classification Search
CPC ..... H04W 84/18; H04L 67/12; H02H 1/0061; H02H 7/263; H04Q 2209/43; H04Q 2209/826; H04Q 2209/845; H04Q 2209/883; H04Q 9/00
USPC ...................................................... 340/870.03
See application file for complete search history.

(56) References Cited

U.S. PATENT DOCUMENTS 3,851,302 A * 11/1974 Schmitt .................... G01V 1/22
                                                                   340/870.13
4,413,259 A    11/1983   Lutz et al.
(Continued)

FOREIGN PATENT DOCUMENTS

CN         101196550 A     6/2008
CN         201229389 Y     4/2009
(Continued)

OTHER PUBLICATIONS

International Search Report from the European Patent Office for International Application No. PCT/EP2009/005520, mailed May 3, 2010.

(Continued)

*Primary Examiner* — Naomi Small
(74) *Attorney, Agent, or Firm* — Finnegan, Henderson, Farabow, Garrett & Dunner, L.L.P.

(57) ABSTRACT

Method and system for monitoring parameters of a cable system of an electric power transmission system, wherein: a plurality of monitoring nodes is associated with different monitoring points of the cable system; the monitoring nodes are operated alternatively in a sleeping mode and in an active mode; in the active modes the monitoring nodes acquire values of at least one of said parameters and process the acquired values so as to generate corresponding output data; a central unit collects the output data generated by the monitoring nodes; the output data generated by the monitoring nodes are sent from the monitoring nodes, when in active mode, toward the central unit by making them pass from one of the monitoring nodes to another, by starting from the monitoring node that generates the output data until a last of the monitoring nodes, which forwards the output data to the central unit.

13 Claims, 14 Drawing Sheets

(51) Int. Cl.
*H04Q 9/00* (2006.01)
*G01R 31/08* (2006.01)
*H02H 1/00* (2006.01)

(52) U.S. Cl.
CPC ......... *H02H 1/0061* (2013.01); *H04Q 2209/30* (2013.01); *H04Q 2209/43* (2013.01); *H04Q 2209/826* (2013.01); *H04Q 2209/845* (2013.01); *H04Q 2209/883* (2013.01)

(56) References Cited

U.S. PATENT DOCUMENTS

| | | | |
|---|---|---|---|
| 4,612,534 A | | 9/1986 | Büehler et al. |
| 5,039,980 A | * | 8/1991 | Aggers ............... H04L 12/2602 340/3.9 |
| 5,434,811 A | * | 7/1995 | Evans, Jr. ........... G11C 14/0072 365/145 |
| 7,091,854 B1 | * | 8/2006 | Miao ...................... H04L 67/12 340/521 |
| 2002/0070845 A1 | * | 6/2002 | Reisinger ................ B60R 25/24 340/5.61 |
| 2005/0073200 A1 | | 4/2005 | Divan et al. |
| 2006/0202664 A1 | | 9/2006 | Lindsey et al. |
| 2008/0049700 A1 | * | 2/2008 | Shah ...................... G01D 21/00 370/342 |
| 2008/0191868 A1 | * | 8/2008 | Lee ......................... H04L 12/66 340/539.22 |
| 2009/0040039 A1 | | 2/2009 | Kaneko et al. |
| 2010/0123572 A1 | * | 5/2010 | Thubert .............. H04L 41/0681 340/527 |

FOREIGN PATENT DOCUMENTS

| | | |
|---|---|---|
| FR | 2 319 167 | 2/1977 |
| JP | 7-169627 | 7/1995 |
| WO | WO 99/58992 | 11/1999 |
| WO | WO 2011/012143 A1 | 2/2011 |

OTHER PUBLICATIONS

Yang, Y. et al., "Power Line Sensornet—A New Concept for Power Grid Monitoring," Power Engineering Society General Meeting 2006, IEEE, Montreal, Canada, pp. 1-8 (2006).

Yang, Y. et al., "Design and Implementation of Power Line Sensornet for Overhead Transmission Lines," Power & Energy society General Meeting 2009, IEEE, Piscataway, NJ, pp. 1-8 (2009).

Engelhardt, et al.; "Design Installation, and Field Experience with an Overhead Transmission Dynamic Line Rating System," Transmission and Distribution Conference Proceedings, 1996, IEEE Los Angels, CA, pp. 366-370 (1996).

http://www.saprem.com/08_3_2_luminosaconductor.pdf, the company SAPREM S.A. de Preformados Metálicos, 2 pages.

Siemens AG, "Centralized Fire Alarm Network Minimizes False Alarms Operates by Continuous Polling and Characteristic Checking Sequence," English-language Abstract of FR 2 319 167, 2 sheets, (Feb. 18, 1977).

http://www.saprem.com/08_3_2_luminosaconductor.pdf, the company SAPREM S.A. de Preformados Metálicos, "Warning Light for Eonductor in High and Medium Tension Llnes," 2 pages.

Notification of the First Office Action issued by the State Intellectual Property Office of the People's Republic of China in corresponding Chinese Application No. 2009801616458.2, dated Nov. 5, 2013.

\* cited by examiner

METHOD AND SYSTEM FOR MONITORING A CABLE SYSTEM OF AN ELECTRIC POWER TRANSMISSION SYSTEM

CROSS REFERENCE TO RELATED APPLICATION

This application is a national phase application based on PCT/EP2009/005520, filed Jul. 30, 2009, the content of which is incorporated herein by reference.

BACKGROUND OF THE INVENTION

1. Field of the Invention

The present invention relates to a method and a system for monitoring a cable system of an electric power transmission system.

2. Description of the Related Art

Electric power transmission from a power generating plant is typically performed by means of high voltage electric power transmission systems that may be aerial (overhead), terrestrial or submarine.

An electric power transmission system typically comprises electric conductors either aerial (overhead), terrestrial or submarine - junctions and terminations.

It is advantageous to monitor various parameters of an electric power transmission system, such as temperature, partial discharges, pressure, voltage, current, etc., during the system operation so that a failure can be detected and located soon after occurrence, or, even better, to try and foresee a possible failure and to schedule the suitable in situ checking.

WO 99/58992, for example, discloses a power cable monitoring system comprising one or more transducers distributed along a sea cable. Each of the transducers is operationally connected to the sea cable for measurement of operational parameters of the sea cable, such as temperature, pressure, voltage, current, etc., and provides an output signal in response to actual parameter values. A data cable extends substantially in parallel with the sea cable. The data cable is operationally connected to the transducers via corresponding branching units, for transmission of output signal to a controller.

WO 99/58992 states that in the power cable monitoring system wherein the transducers and associated electronic circuits receive their power supply from batteries, considerable power savings may be obtained by designing the electronic circuits to operate in a power down mode and in an active mode. In the power down mode, the circuits are in an idle mode and no data is transmitted to the data cable, and in the active mode transducer parameter values are converted into data signals for transmission through the data cable. Operation of the circuits may be controlled by means of a timer circuit comprised in the transducer signal converter. The timer may be programmed to interrogate the transducer signal converter at predetermined time intervals. Upon timer interrogation, the transducer signal converter changes operation mode from its power down mode to its active mode. In the active operation mode, the transducer output signal is converted into a data signal and the data signal is transmitted to the controller. The transducer signal converter returns to its power down mode after the data signal has been transmitted.

SUMMARY OF THE INVENTION

The Applicant faced the technical problem of providing an improved monitoring system for monitoring parameters of a cable system for electric energy transmission.

In particular, the Applicant faced the technical problem of reducing power consumption in a system for monitoring a cable system for the transmission of electric energy.

As disclosed in more detail below, the Applicant found that this problem can be solved by a monitoring system comprising a cascade of monitoring nodes adapted to alternatively operate in a sleeping mode and in an active mode, wherein the data acquired by the monitoring nodes during active modes are sent towards a central unit by making the data pass from one monitoring node to another, by starting from the monitoring nodes that generate the output data till a last monitoring node, which forwards the output data to the central unit.

Accordingly, in a first aspect the present invention relates to a monitoring system for monitoring parameters of a cable system of an electric power transmission system, the monitoring system comprising a central unit and a plurality of monitoring nodes adapted to be placed at different monitoring points of the cable system, wherein:
each monitoring node is adapted to alternatively operate in a sleeping mode and in an active mode, during active mode each monitoring node being adapted to acquire a value of at least one of said parameters and to process the acquired value so as to generate corresponding output data; and
the central unit is adapted to collect the output data coming from the monitoring nodes;
characterized in that the monitoring nodes are connected in cascade and in that, during active mode, each monitoring node is adapted:
to receive output data from an upward node of the cascade, if any; and
to send to a downward node, if any, the output data received from said upward node and the output data generated by the monitoring node itself, a last monitoring node of the cascade being adapted to send said output data to the central unit.

In the present description and claims the expression:
"upward monitoring node" with respect to a given monitoring node is used to indicate a node that precedes said given monitoring node with respect to a direction of propagation of data towards a central unit. The expression "upward monitoring node" can be used to indicate a node that, with respect to said given monitoring node, is farther from the central unit;
"downward monitoring node" with respect to a given monitoring node is used to indicate a node that follows said given monitoring node with respect to a direction of propagation of data towards a central unit. The expression "downward monitoring node" can be used to indicate a node that, with respect to said given monitoring node, is closer to the central unit;
"last monitoring node", with respect to a cascade of monitoring nodes, is used to indicate the last monitoring node of the cascade with respect to a direction of propagation of data towards a central unit. The expression "last monitoring node" can indicate the node closest to the central unit;
"first monitoring node", with respect to a cascade of monitoring nodes, is used to indicate the first monitoring node of the cascade with respect to a direction of propagation of data towards a central unit. The expression "first monitoring node" can indicate the node farthest to the central unit;
"sleeping mode" is used to indicate an idle mode of a node wherein the node does not perform any operation of data receipt, data transmission and data acquisition;

"active mode" is used to indicate an operating mode of a node wherein the node performs operations of data receipt, data transmission and/or data acquisition;

"cascade" is used to indicate a plurality of monitoring nodes connected in series so that the output data of one are transmitted to the next, with respect to a direction of propagation of data towards a central unit;

"data link" is used to indicate a path through which at least two devices (e.g., nodes, central unit, can transmit data to each other.

For the purpose of the present description and of the appended claims, except where otherwise indicated, all numbers expressing amounts, quantities, percentages, and so forth, are to be understood as being modified in all instances by the term "about". Also, all ranges include any combination of the maximum and minimum points disclosed and include any intermediate ranges therein, which may or may not be specifically enumerated herein.

Advantageously, the monitoring nodes are adapted to operate alternatively in sleeping mode and in active mode according to synchronized time frames.

Advantageously, the time frames are synchronized in such a way that the monitoring nodes pass from a sleeping mode to an active mode in sequence, one after the other.

Preferably, the time frames are synchronized in such a way that each monitoring node starts to operate in an active mode before (preferably right before) the upward monitoring node starts sending to it the output data.

Preferably, the time frames are synchronized so as to minimize the waiting time for receiving output data from an upward monitoring node.

The monitoring nodes can be distributed along the cable system to be monitored.

Advantageously, the monitoring nodes are connected to each other in cascade through a plurality of data links.

The data links can be wired or wireless, the latter being preferred.

In case of wired link, the data link can be an optical fiber link (comprising at least one optical fiber) or an electrical link (comprising at least one electrical wire, preferably at least two electrical wires).

In case of optical fiber link, each monitoring node advantageously comprises electro-optical converters.

In case of wireless link, the data link can be a radio frequency (RF) link.

In case of wireless link, each node advantageously comprises at least one antenna and at least one RF transceiver.

The data links each can have a length of from 1 m to 1600 m, if wireless, of from 1 m to 40 km, if wired with optical fiber, or of from 1 m to 1 km, if wired with electrical wire.

Preferably, the data links each has a length of from 20 m to 200 m, if wireless or wired with electrical wire, or of from 1 m to 1 km, if wired with optical fiber.

In view of reducing power consumption, these ranges of data link lengths are given in order to enable low power data transmissions between monitoring nodes (as, for example, RF wireless data transmissions with irradiated power levels equal to or lower than 100 mW, preferably equal to or lower than 1 mW).

Moreover, the above mentioned ranges of data link lengths are advantageously selected so as to obtain a good compromise between cost and reliability.

Indeed, shorter data link lengths could imply a larger number of nodes and, thus, higher costs. On the other hand, they can imply higher reliability because they can enable to collect more information and, in case of failure, to reduce the risk of missing important information about a point of the cable system (the information may be obtained by a nearby node).

The central unit itself can be adapted to operate alternatively in a sleeping mode and in an active mode, with a time frame synchronized with the time frame of the last monitoring node of the cascade. In this case, the central unit is adapted to receive the output data from the last monitoring node of the cascade only when operating in an active mode.

Typically, the monitoring nodes comprise each at least one sensor. The sensor may be adapted to detect at least one parameter, for example the temperature of a cable of the cable system, ambient temperature, ambient humidity, water flooding, cable current, screen current, cable voltage, fire, gas, aperture of access doors, cable strain, cable displacement, vibrations, and similar.

Advantageously, the monitoring system comprises a processing station adapted to process the output data coming from the monitoring nodes. This allows to provide an operator with useful information indicative of the operating conditions of the cable system.

Advantageously, the processing station is a remote station.

The central unit is advantageously adapted to act as interface between the last monitoring node of the cascade and the processing station and to send output data received by the last node of the cascade to the processing station. The central unit can be connected to a modem or a router for communicating with the remote station.

According to a preferred embodiment, at least one of the monitoring nodes comprises a partial discharge unit adapted to detect possible partial discharges occurring in the cable system.

In a second aspect the present invention relates to an electric power transmission system comprising
  a cable system for electric power transmission; and
  a monitoring system according to the first aspect of the invention, for monitoring parameters of the cable system, the monitoring system comprising a central unit and a plurality of monitoring nodes placed at different monitoring points of the cable system.

The electric cable system can be a low, medium and/or, preferably, high voltage electric cable system.

The term low voltage is used to indicate voltages lower than 1 kV.

The term medium voltage is used to indicate voltages of from 1 to 35 kV.

The term high voltage is used to indicate voltages higher than 35 kV.

The electric cable system may be of the aerial, terrestrial, submarine or windmill type.

The cable system typically comprises at least one cable.

The cable can be an AC cable.

The cable system can comprise a plurality of (that is, more than one) cables.

Aerial cables typically comprise an aluminium-steel electric conductor. As aerial cables are used in overhead plants, the electric conductor is typically bare, the air forming the main insulating element.

Terrestrial cables can be at least in part buried or positioned in tunnels.

Terrestrial, submarine and windmill cables advantageously comprise at least one core. The core advantageously comprises an electric conductor surrounded by at least one insulating layer and at least one protective sheath. Optionally, the core can further comprise at least one semiconductive layer. Optionally, the core can further comprise a metal screen.

The core can be a single phase core. Preferably, the cable comprises at least two cores.

The monitoring nodes can be operatively associated with one or more cables of the cable system and/or with one or more cores of a same cable.

In a preferred embodiment of the invention, the at least two cores are individually insulated, individually sheathed and, optionally, individually screened.

In an embodiment, the at least two cores are laid down with at least part of their outer surface adjacent to or in contact with each other.

In AC systems, the cable advantageously is a three-phase cable. The three-phase cable advantageously comprises at least three insulated single phase cores.

The three insulated cores can be protected together within a single sheath or they can be individually protected within three separate sheaths.

The three insulated cores may be on a planar configuration or in a trefoil configuration. In the planar configuration the three insulated cores have the longitudinal axes thereof lying substantially parallel in a same plane. In the trefoil configuration, the three insulated cores are reciprocally positioned in such a way that, in a cross section taken along their longitudinal axes, they have, as a whole, a trefoil shape.

The cable system typically further comprises cable junctions and terminations.

The monitoring nodes can be supplied by a remote main power source, for example through a suitable electric supply line, but, preferably, the monitoring nodes are supplied by local energy generators.

The present invention, by reducing power consumption of the monitoring system, is particularly advantageous when the monitoring nodes are supplied by local energy generators producing electric energy by exploiting local sources. Indeed, the energy provided by a local source can be quantitatively not uniform and discontinuous with time. With the expression "local sources" it is meant a generative force located in the cable system or in the environment where the cable system operates as, for example, a magnetic field generated by the alternate current (AC) flowing along an electric cable of the cable system, vibrations, sunlight.

The local electric energy generators may, for example, be of the photovoltaic type (in case of aerial cable system) or of the vibration type (adapted to transform cable vibrations into electric energy).

According to a preferred embodiment of the invention, the local electric energy generators are of the magnetic type, adapted to transform the magnetic field generated by an alternating current flowing along an AC cable of the cable system into electric energy.

Preferably, the local electric energy generators comprise each an apparatus for generating electric energy comprising:
an arc shaped ferromagnetic body extending along a longitudinal axis; and
least one electrically conducting winding wound around the ferromagnetic body to form turns in planes substantially perpendicular to the arc.

The expression "in planes substantially perpendicular to the arc" can indicate that the turns formed by the winding lie in planes that might deviate from planes perpendicular to the arc of ±5°, preferably, ±1°. Preferably, the planes can deviate of ±0.35°. The more perpendicular are the planes of the turns to the arc the higher is the coupling efficiency of the magnetic field into the winding.

The ferromagnetic bodies of the local electric energy generators are adapted to be operatively associated with at least one AC cable of the cable system, to partially surround corresponding portions of the external surface of a core of the at least one AC cable.

When the AC cable comprises at least two cores, the ferromagnetic bodies of the apparatuses for generating electric energy can be operatively associated on one of the cores of the cable. Alternatively, part of the ferromagnetic bodies can be operatively associated with one of the cores and another part of the ferromagnetic bodies can be operatively associated with the other core(s). In an embodiment, the at least two cores comprise each an insulated, individually sheathed, electric conductor.

When the cable system comprises more than one AC cable, the ferromagnetic bodies of the local electric energy generators can be operatively associated with one or more AC cables of the cable system and/or with one or more cores of a same AC cable Preferably, the ferromagnetic bodies are fixed upon a portion of an external surface of an outmost layer, typically a sheath, of the core(s).

The use of an arc shaped ferromagnetic body is particularly advantageous in the case of at least two insulated cores, individually sheathed (and, optionally, individually screened), that are laid down with at least part of their outer surface adjacent to or in contact with each other. For example, it is particularly advantageous in the case of three insulated conductors, individually sheathed (and, optionally, individually screened), positioned in a trefoil configuration.

Indeed, the ferromagnetic body with a cross section defined by an arc enables the local electric energy generator to be fixed upon a free portion of the outer surface of one of the at least two cores (that is, on a portion that is not adjacent to or in contact with the outer surface of the other core(s)).

Advantageously, the arc shape is such as to surround the core by leaving a gap smaller than 10 mm.

In the case of a core having an external diameter ranging from 4 to 20 cm, the internal bending radius of the arc can be of from 2 to 10 cm.

For arc shaped ferromagnetic body extending along a longitudinal axis it is intended a body that, in a cross section taken along said longitudinal axis, has a shape defined by an arc that can extend for an angle lower than 360°.

Said arc advantageously extends for an angle lower than 300°. Said arc advantageously extends for an angle at least equal to 45°.

In an embodiment, the ferromagnetic body has a substantially semi-circular cross section. That is, the ferromagnetic body is substantially semi-cylindrical.

Preferably, said arc extends for an angle at least equal to 180°. For example, in a preferred embodiment, body said arc extends for an angle of about 270°.

The ferromagnetic body can be made of a monolithic metal or of a metal in form of a plurality of lamellae.

Preferably, for a body of 10 cm in length by 1 cm in thickness, the winding comprises a number of turns of from 400 to 800.

The winding preferably has a diameter in the range of 0.2 mm to 3 mm, more preferably, between 0.4 mm to 1.5 mm.

The ferromagnetic body preferably has a length of from 6 cm to 40 cm. This range can enable to obtain a good compromise between the needs of having a compact apparatus and the need of generating useful power levels.

The above mentioned ranges of number of turns, winding diameter, and ferromagnetic body length are exemplary ranges that allow power levels of practical utility to be obtained from the apparatus for generating electric energy.

Advantageously, the winding is made of an insulated metallic conductor, as a copper wire, preferably with enamelled insulation.

In a third aspect the present invention relates to a method of monitoring parameters of a cable system of an electric power transmission system, wherein:

a plurality of monitoring nodes is associated with different monitoring points of the cable system;

the monitoring nodes are operated alternatively in a sleeping mode and in an active mode;

in active modes the monitoring nodes acquire values of at least one of said parameters and process the acquired values so as to generate corresponding output data;

a central unit collects the output data generated by the monitoring nodes; characterized in that the output data generated by the monitoring nodes are sent from the monitoring nodes, when in active mode, towards the central unit by making them pass from one of the monitoring nodes to another, by starting from the monitoring node that generates the output data till a last of the monitoring nodes, which forwards the output data to the central unit.

The Applicant observes that the invention allows data collection to be performed by means of data links of reduced length, while maintaining the ability to connect to a distant central unit and to cover long distances. Data links of reduced length can allow transmitting the output data through said data links by means of signals of reduced transmission power and, thus, reducing the power consumption of the monitoring nodes.

This can be particular advantageous in case of RF or electrical links wherein power reduction of transmitted signals is an important issue.

Furthermore, power consumption reduction is advantageous in that it allows reducing costs. Moreover, it gives the possibility of using local energy generators producing electric energy by exploiting local sources. Indeed, the energy provided by a local source can be quantitatively not uniform and discontinuous with time.

The Applicant further observes that RF data links can be advantageous with respect to wired links because they reduce costs and problems associated with installation of the monitoring system, especially in the case of long distance monitoring systems.

In a RF monitoring system, the invention allows the central unit to collect data also from nodes that are positioned at such a distance and/or position that a RF direct communication with the central unit would not be possible (for example, because of barriers to RF propagation and/or long distances that make the RF signal too weak to be received by the central unit).

Accordingly, the invention advantageously improves the possibility of exploiting RF monitoring systems and, in particular, gives the possibility of increasing the distance covered by a RF monitoring system.

BRIEF DESCRIPTION OF THE DRAWINGS

The features and advantages of the present invention will be made apparent by the following detailed description of some exemplary embodiments thereof, provided merely by way of non-limiting examples, description that will be conducted by making reference to the attached drawings, wherein.

DETAILED DESCRIPTION OF THE INVENTION

Figure 1:
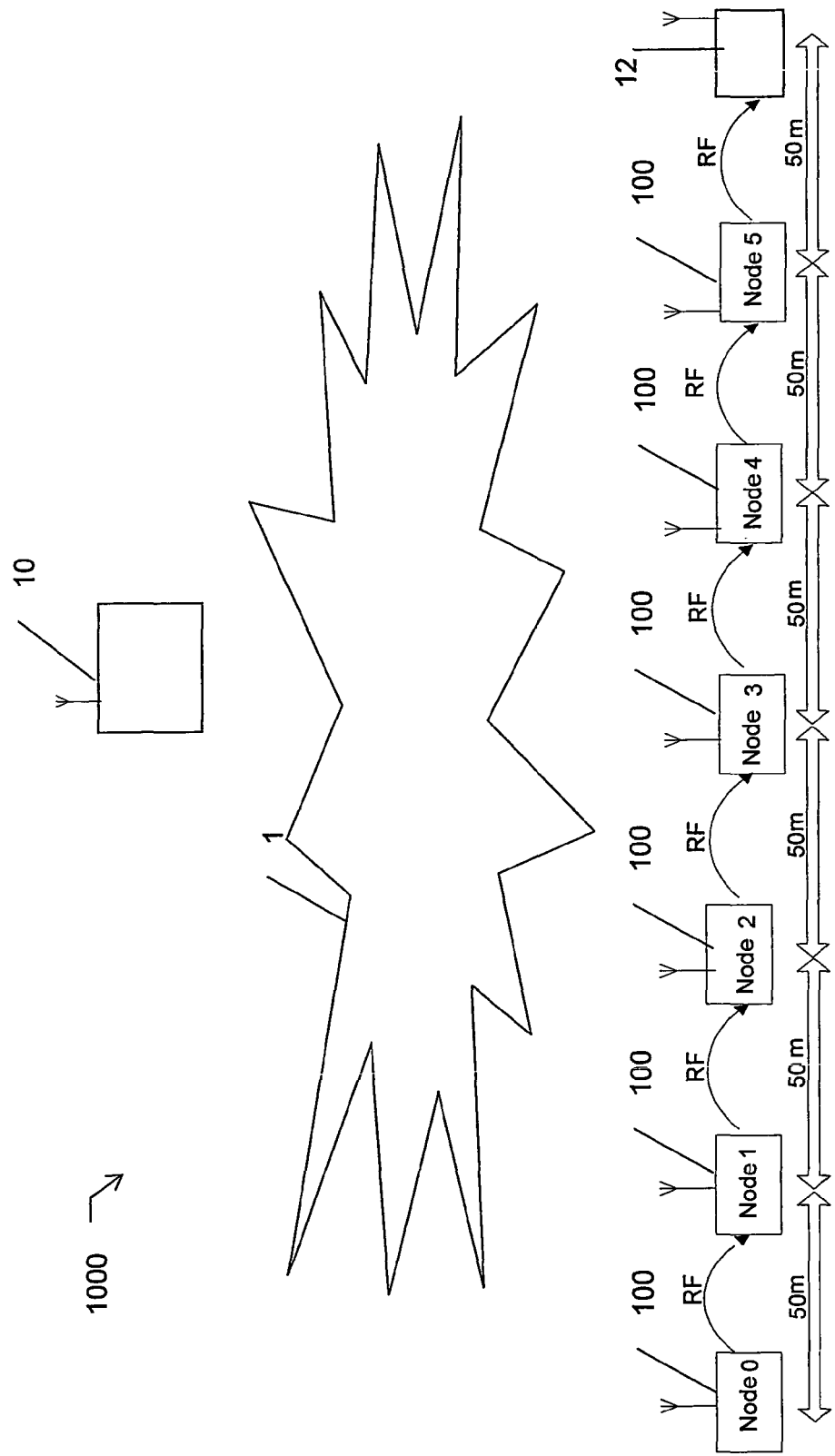
FIG. 1 schematically shows an embodiment of a monitoring system according to the invention.

FIG. 1 shows an embodiment of a monitoring system 1000 according to the invention comprising a plurality of monitoring nodes 100, a central unit 12 and a remote processing station 10.

Even if in FIG. 1 there are exemplarily shown five monitoring nodes 100, it will be clear that the monitoring system 1000 can comprise more or less than five monitoring nodes, depending on the needs and the length to be covered by the monitoring system 1000.

An example of monitoring system 1000 comprises up to 256 monitoring nodes, at a distance of 50 m from each other, so as to cover a length of 12.8 km.

The monitoring nodes 100 are placed in cascade at different distances from the central unit 12.

Preferably, the monitoring nodes 100 are equidistant. Moreover, the distance between the last node (node 5) and the central unit 12 is preferably the same as the distance between two nodes. This allows the design of the monitoring nodes, as far as concern transmission/reception parameters, to be the same.

In the above-mentioned example, the distance between two nodes and between the last node and the central unit 12 is of 50 m.

The central unit 12 is preferably positioned at the end of the cascade of monitoring nodes 100. The central unit may be positioned at a manhole (for example underground) or at a shunting substation (which can be underground or above the ground, for example in a building), wherein connection to a main power source and/or the remote processing station 10 is typically easier.

The central unit 12 can be connected to a modem or to a router (not shown), for example through a wired connection.

The central unit 12 acts as interface between the last node (e.g., node 5) and the remote processing station 10.

The central unit, especially when connected to a main power source, can be operated always in active mode.

Figure 2:
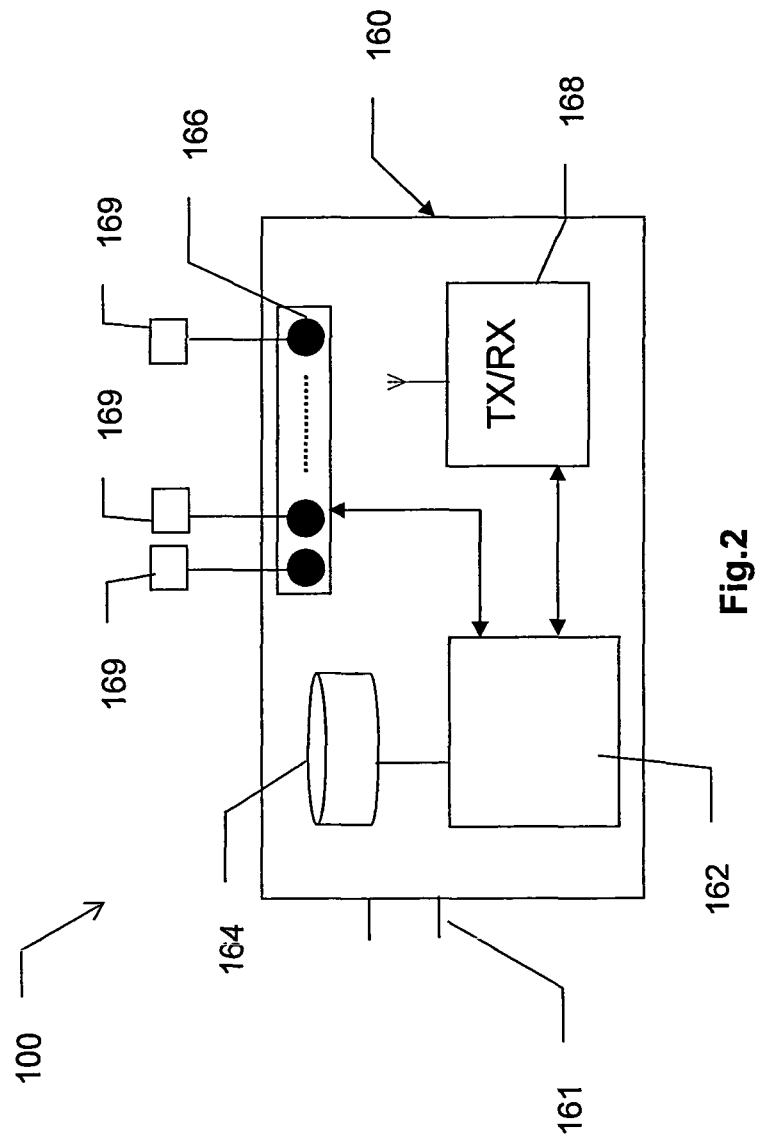
FIG. 2 schematically shows an embodiment of a monitoring node of the monitoring system of FIG. 1.

In the embodiment of FIG. 2, the monitoring node 100 comprises an electronic board 160 and a plurality of sensors 169.

The electronic board 160 comprises a programmable low power microprocessor 162, a backup battery 164, a plurality of connectors 166 for the sensors 169, a wireless and low power transceiver 168 and a power supply connector 161.

A low power microprocessor advantageously is a microprocessor that operates consuming less than 200 mW, preferably less than 100 mW.

The low power transceiver 168 comprises an antenna system for reception/transmission of RF signals. Moreover, it is adapted to convert RF signals received by the antenna system into electric signals and to convert electric signals into RF signals to be transmitted by the antenna system.

For example, the microprocessor and the transceiver are integrated in a 2.4 GHz XBee module from the company Digi International.

The power supply connector 161 is advantageously adapted to be connected to a local energy generator.

The function of the backup battery 164 advantageously is that of accumulating the electric energy generated by the local energy generator, when it exceeds the energy necessary to supply the monitoring node 100, and to subsequently supply the monitoring node 100 with the accumulated energy, in case of future need (for example when no energy or low energy is produced by the local energy generator). In this embodiment, in case of failure of the backup battery 164, the monitoring node can continue being supplied by the local energy generator as long as there is an energy generation.

The electronic board 160 advantageously further comprises a protection system (not shown) to prevent damage from any high voltages and/or high currents that may be induced during short circuits of the power lines. A protection system suitable for the present invention can comprise at least one surge arrester. Moreover, in order to prevent damage from any high voltages and/or high currents the supply connector 161 preferably has two pins spaced of at least 5 mm. The electronic board 160 advantageously further comprises a rectifier circuit (not shown) that converts the alternating current (AC) coming from the local energy generator to direct current (DC), which is suitable for being used by the various components of the electronic board 160.

According to an embodiment (not shown), the local energy generator can be connected to the electronic board through a rectifier circuit and a battery.

In this case, the electronic board is supplied with the intermediation of the battery, the function of the rectifier circuit being that of converting the alternating current (AC) coming from the local energy generator to direct current (DC), which is supplied to the battery.

However, in this embodiment, in case of failure of the battery, the monitoring node stops to be supplied by the local energy generator, until the battery is replaced or repaired.

The microprocessor 162 is adapted to acquire information from the different sensors 169 connected to the connectors 166.

The sensors 169 are adapted to measure at least one parameter of a cable system of an electric power transmission system, wherein the cable system typically comprises cables, cable junctions and/or terminations.

The sensors may be of the type known to detect, for example, ambient temperature, ambient humidity, surface cable temperature, water flood, cable current and other parameters of interest, especially for evaluating the overall performance of the cable system.

The sensors 169 of a monitoring node 100 are adapted to be fixed onto a monitoring point of the cable system, in any suitable way for measurement of the corresponding parameter.

The monitoring point can be a point of a cable of the cable system, a point of a cable junction or a point of a termination.

Typically, the sensors 169 are attached according to conventional techniques to an outer sheath of a cable or to an outer surface of a junctions or termination.

According to the invention, each monitoring node 100 is adapted to alternatively operate according to a sleeping mode and an active mode.

During sleeping mode, the monitoring node is in a idle state wherein no reception, transmission and acquisition operations are performed.

In active mode, the microprocessor 162 of the monitoring node 100 is adapted to acquire the information measured by the various sensors 169 connected to the connectors 166 and to convert said information so as to generate output data adapted to be transmitted by the transceiver 168, according to a determined communication protocol.

In active mode, the microprocessor 162 is also adapted to receive from the upward monitoring node, through the transceiver 168, the output data generated by the upward monitoring node and by other upward monitoring nodes of the cascade, if any.

Moreover, in active mode, the microprocessor 162 is also adapted to send to the downward monitoring node, if any, through the transceiver 168, the output data received from the upward monitoring node and the output data generated in the monitoring node itself.

For example, in the embodiment shown in FIG. 1, node 0, which is the first node of the cascade, is adapted, in active mode, to acquire the information measured by its own sensors; to convert said information into suitable output data; and to transmit said output data to node 1.

Node 1, when in active mode, is adapted to receive the output data from node 0; to acquire the information measured by its own sensors; to convert said information into suitable output data; and to transmit to node 2 both the output data received from node 0 and the output data generated by node 1 itself.

Node 2, when in active mode, is adapted to receive the output data from node 1 (that comprise both the data generated by node 0 and the data generated by node 1); to acquire the information measured by its own sensors; to convert said information into a suitable output data; and to transmit to node 3 both the output data received from node 1 and the output data generated by node 2 itself.

Nodes 3 and 4 will act in a way similar to node 2.

Node 5, which is the last node of the cascade, is adapted, when in active mode, to receive the output data from node 4 (that comprise all the output data generated by node 0 to node 4); to collect the information acquired by its own sensors; to convert said information into a suitable output data; and to transmit to the central unit 12 both the output data received from node 4 and the output data generated by node 5 itself.

The central unit 12 is adapted to receive from the last node (e.g. from node 5) the output data generated by all monitoring nodes 100, and to process said output data so as to send them, through a modem or router, to the remote processing station 10, according to a predetermined communication protocol.

In its turn, the remote processing station 10 is adapted to process, according to conventional techniques, the data received from the central unit 12 and to perform data storing, analysis, visualization (typically using a human readable interface) and alarm generation, when required. Advantageously, the remote processing station 10 is adapted to identify the data coming from each single sensor of each single node; to fix given limits for each sensor; and to automatically generate a specific alarm when a limit of one of the sensors is exceeded. Alarms may be transmitted by e-mail, SMS (Short Message Service) messages, phone calls, and similar.

According to the invention, the output data generated by the various monitoring nodes 100 are thus collected by the central unit 12 by making the output data pass from one monitoring node to another, by starting from the first monitoring node till the last monitoring node of the cascade. In its turn, the last monitoring node is connected to the central unit 12 so as to send to it the output data generated by all monitoring nodes 100.

In this way the length of the data links used to transmit the output data is reduced with respect to a system, as that disclosed by the above mentioned WO 99/58992 document, wherein each node is directly connected to a central controller, which is positioned at the end of the sequence of monitoring nodes 100.

In the embodiment of FIG. 1, the length of the data links used to transmit the output data is of 50 m.

In order to avoid the loss of important information and in order to minimize the waiting time of a monitoring node for receiving the output data from an upward monitoring node, the monitoring nodes advantageously alternatively operate in sleeping mode and in active mode according to synchronized time frames.

According to an embodiment of the invention, the monitoring nodes are adapted to carry out a process of auto-synchronization and a process for automatically maintaining the synchronization.

According to an embodiment of the process of auto-synchronization, when the monitoring nodes are not synchronized (for example, when the monitoring system starts working for the first time or when the internal clock of a monitoring node works not properly), the first monitoring node of the cascade (e.g., node 0) is adapted to alternatively operate in sleeping mode and in active mode with a period T (which indicates the time between the beginning of two consecutive active modes) while the other monitoring nodes (e.g., node 1, 3, 4 and 5) operate with a period T1. In order to facilitate the synchronization process, T1 is preferably lower than T. For example, T=6 seconds and T1=5 seconds. Moreover, all monitoring nodes initially remain in active mode for a time Ta. Preferably, Ta<<T1 and T. For example, Ta=100 ms.

Figure 3:
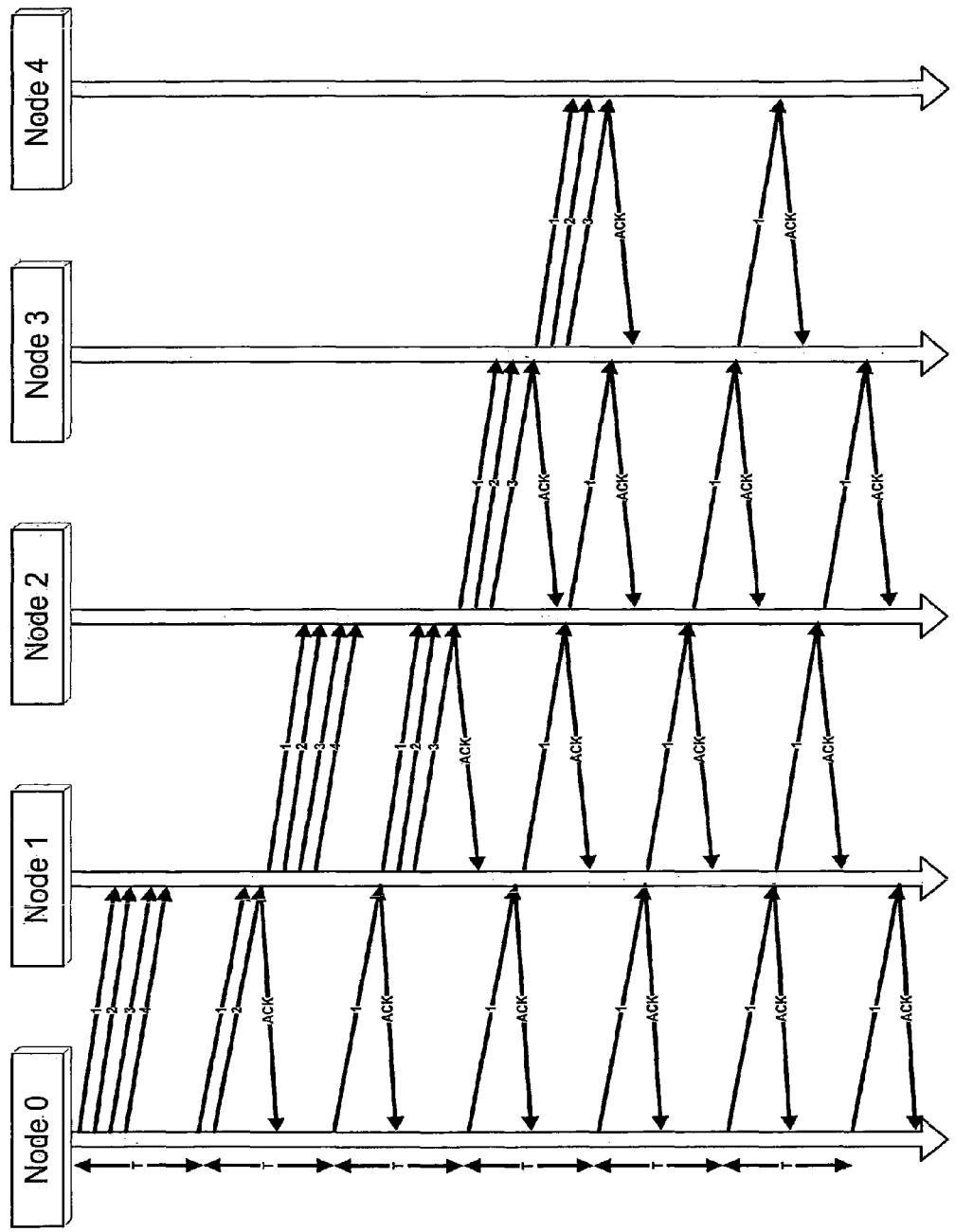
FIG. 3 schematically shows an example of an auto-synchronization process performed by a monitoring node of a monitoring system according to the invention.

Then, as shown in FIG. 3, when in active mode, the first monitoring node (e.g., node 0) starts sending the output data generated by itself to the second node (e.g., node 1). If the first monitoring node does not receive an ACK message (indicating data reception) from the second node, the first monitoring node sends the same data to the second node for a number of times (e.g., 4 times).

When the second node receives the output data from the first monitoring node, it starts operating with a period T and sending the output data generated by itself, together with the output data received by the first node, to the third node (e.g., node 2). If the second monitoring node does not receive an ACK message from the third node, the second monitoring node sends the same data to the third node for a number of times (e.g., 4 times).

When the third node receives the output data from the second monitoring node, it starts operating with a period T and sending the output data generated by itself, together with the output data received by the second node, to the fourth node (e.g., node 3).

The above process is continued till also the last monitoring node is synchronized (e.g., node 4 in FIG. 3).

Once synchronized, the monitoring nodes operate in sleeping mode and active mode with a period T.

During active mode, each monitoring node first waits to receive output data from the upward monitoring node. Then—after receipt of the output data—it transmits them Lo the downward monitoring node together with the output data generated by itself.

Figure 4A:
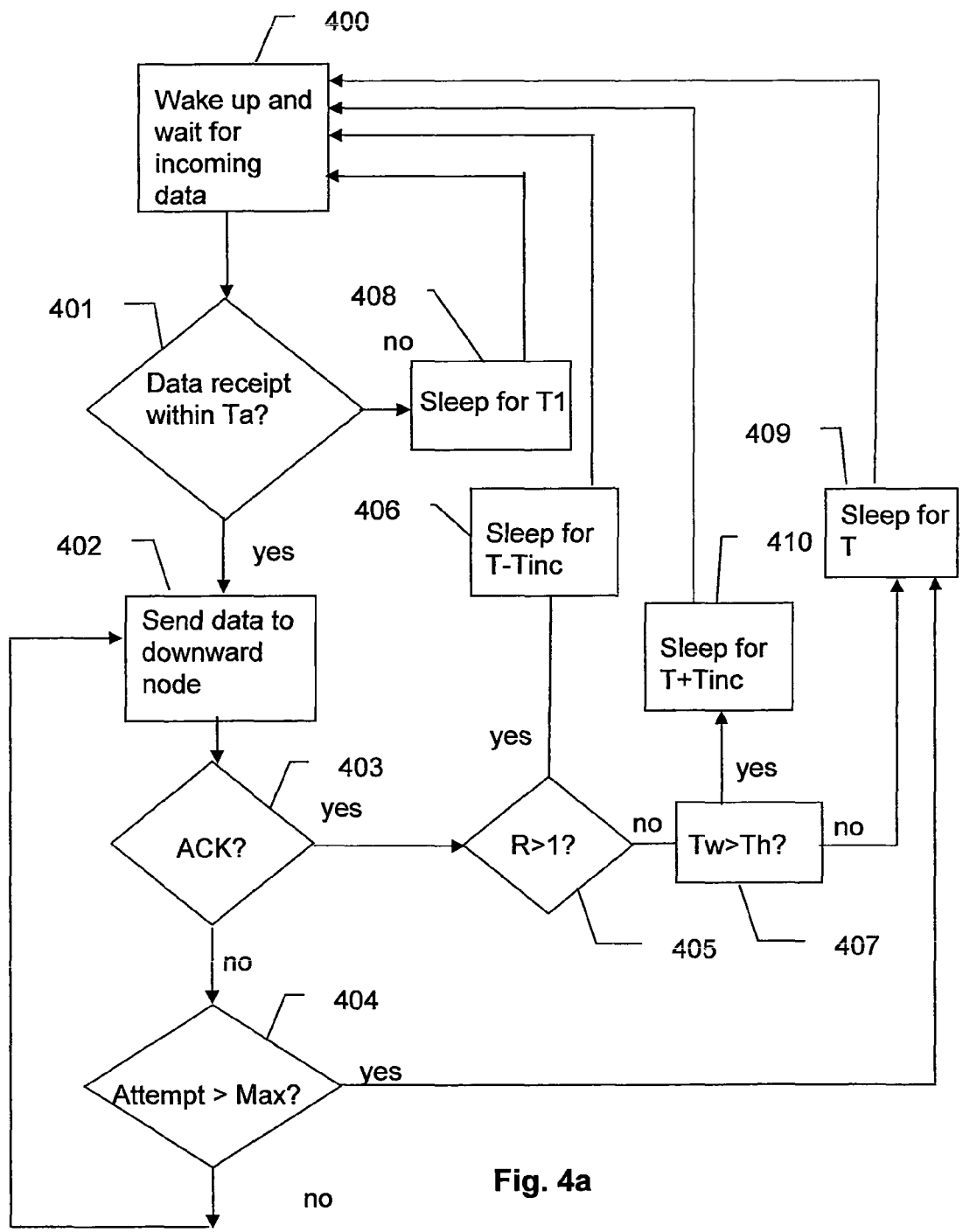
FIGS. 4a and 4b schematically show two exemplarily flowcharts outlining the main actions carried out by the monitoring nodes of a monitoring system according to the invention, in order to maintain synchronization between nodes while alternatively operating in a sleeping mode and in an active mode.

FIG. 4a shows an embodiment of the process for automatically maintaining synchronization between monitoring nodes. At block 400 monitoring node N passes from a sleeping mode to an active mode and waits for reception of output data from upward monitoring node N−1. At block 401 the monitoring node N checks output data reception from the upward monitoring node N−1.

If no output data are received within a time Ta, then at block 408 the monitoring node passes in sleeping mode till time T1 lapses, starting from the moment the monitoring node has woken up at block 400.

If output data are received within time Ta, then the monitoring node N sends to the downward monitoring node N+1 the output data received from the upward monitoring node N−1, together with the output data generated by itself (block 402).

Preferably, Ta<<T1, T. For example, Ta=100 ms.

After sending the output data, at block 403 the monitoring node N checks reception of an ACK message from the downward monitoring node N+1.

If the ACK message is received, the procedure passes to block 405.

If no ACK message is received, at block 404 the monitoring node N checks if a maximum number Max (e.g., Max=4) of attempts to send the output data to the downward monitoring node N+1 has been exceeded. In the negative case, the procedure goes back to block 402. In the positive case, the procedure passes to block 409.

At block 405 the monitoring node N is advantageously adapted to check if a number R is higher than 1, wherein number R indicates the number of attempts made by the monitoring node N−1 for sending the output data to monitoring node N, before monitoring node N receives the output data at block 401.

If R>1, then at block 406 the monitoring node N passes in sleeping mode till time T-T$_{inc}$ lapses, starting from the moment the monitoring node has woken up at block 400.

If R<1 (e.g., if R=0), then at block 407 the monitoring node N is advantageously adapted to check the time Tw lapsed between the moment the monitoring node N has woken up at block 400 and the time the monitoring node N has received the output data from the upward monitoring node N−1 at block 401.

If waiting time Tw is higher than a predetermined threshold (Th), at block 410 the monitoring node N passes in sleeping mode till a time T+T$_{inc}$ lapses, starting from the moment the monitoring node has woken up at block 400.

If waiting time Tw is lower than the predetermined threshold (Th), the procedure passes to block 409.

At block 409 the monitoring node N passes in sleeping mode till a time T lapses, starting from the moment the monitoring node has woken up at block 400.

For example, Th is equal to 5 ms.

Preferably, Tinc<<Ta. This allows the synchronization maintenance process of the monitoring node N to be performed in little steps that do not compromise the synchronization of the other monitoring nodes. For example, Tinc is equal to 1 ms.

The check at block 405 has the purpose of minimizing the number of attempts made by the monitoring node N−1 for sending output data to monitoring node N and thus of reducing the power consumption of node N−1.

The check at block 407 has the purpose of minimizing the waiting time Tw for receiving the output data from the upward monitoring node N−1. In this way the duration of an active mode can be advantageously reduced and the power consumption of the monitoring node further reduced.

Figure 4B:
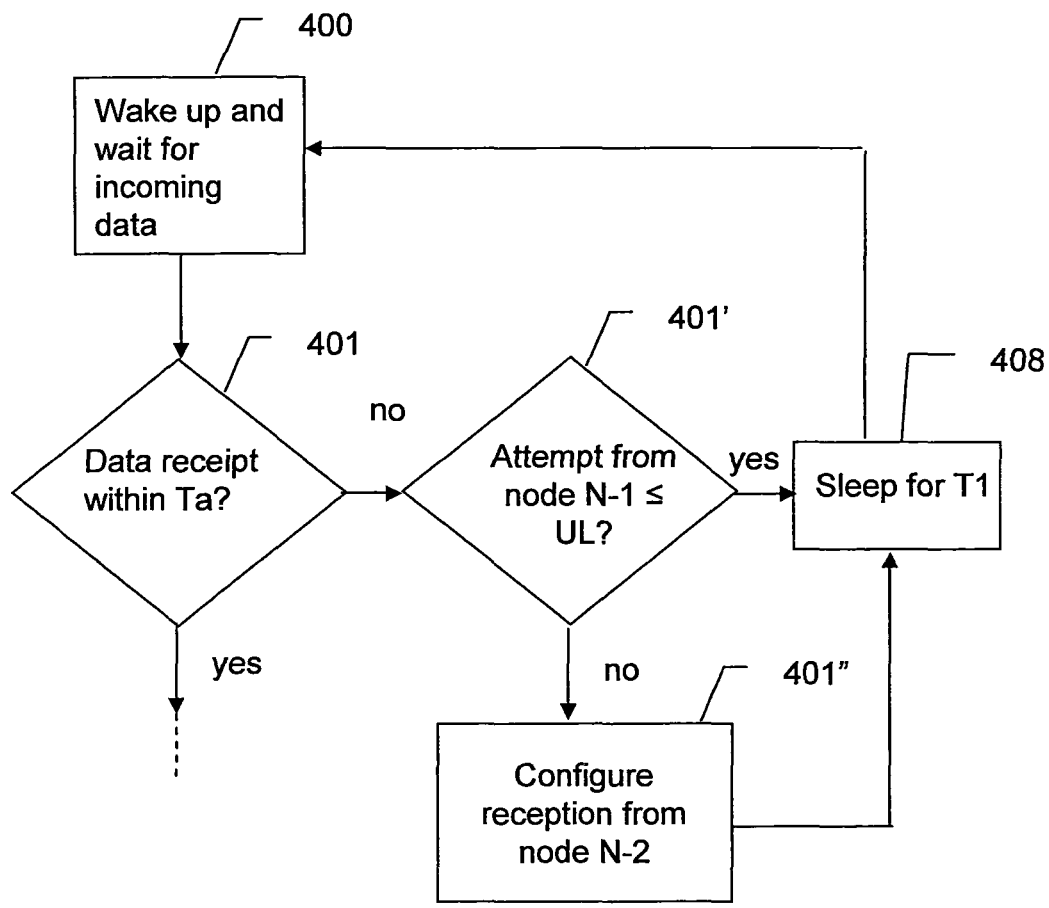

According to a preferred embodiment of the invention, schematically shown in FIG. 4b, in case the check at block 401 is negative, monitoring node N is also advantageously adapted to check at block 401' if the number of attempts performed in order to receive output data from the directly upward monitoring node N−1 is lower than an upper limit UL. In the positive case, the procedure passes to block 408. In the negative case, before passing to block 408, at block 401" monitoring node N is configured so as to enable it to receive output data from the upward monitoring node N−2.

Even if not shown, the same procedure might be extended to cover also the case in which the number of attempts performed in order to receive output data from the upward monitoring node N−2 has reached an upper limit UL, and so on.

It is noted that, for the sake of expediency, in FIG. 4b blocks 402 to 407 are not shown.

The embodiment of FIG. 4b advantageously allows automatically coping with a possible failure of a node of the cascade so that the data collection process can proceed even in case of a node failure.

In the preferred embodiment of FIG. 4b, the monitoring nodes and the data links will be configured so as to enable a monitoring node N to receive data from at least one monitoring node N−2 preceding the directly upward monitoring node N−1.

Advantageously, in case of failure of a monitoring node, the remote server—detecting an absence of data coming from said node—can be adapted to generate a suitable alarm.

In view of the above description, it will be clear that in the present description and claims the expressions "upward monitoring node" and "downward monitoring node" are advantageously used to indicate the first working (not failed) upward monitoring node and the first working (not failed) downward monitoring node, respectively. Similarly, the expression "last monitoring node" is advantageously used to indicate the last working (not failed) monitoring node of the cascade.

In the embodiment shown in FIGS. 1 and 2, the monitoring nodes 100 communicate with each other through RF wireless data links.

Also the last monitoring node 100 (node 5) and the central unit 12 communicate with each other through a RF wireless data link.

RF data links are typically advantageous compared to wired link because they reduce installation times and costs.

For example, communications over the RF data links are performed according to a standard protocol such as the IEEE 802.15.4 protocol, operating at 2.4 GHz.

According to this protocol, data are sent through 123 bytes data frames and time multiplexing is used to put the data of each monitoring node in this data frame, according to techniques well known in the art.

In particular, each data frame will be generated by the first node and each monitoring node will be adapted to put its own output data into the data frame received from the upward monitoring node and to transmit the data frame, containing its own output data and the output data of the upward monitoring nodes, to the next node until the last node is reached. Moreover, each monitoring node, before transmitting the data frame, will be adapted to update a "sender address" field of the data frame in order to identify itself (e.g., by using a suitable identifier) as sender of the data frame in place of the upward monitoring node from which it has received the packet.

Figure 7:
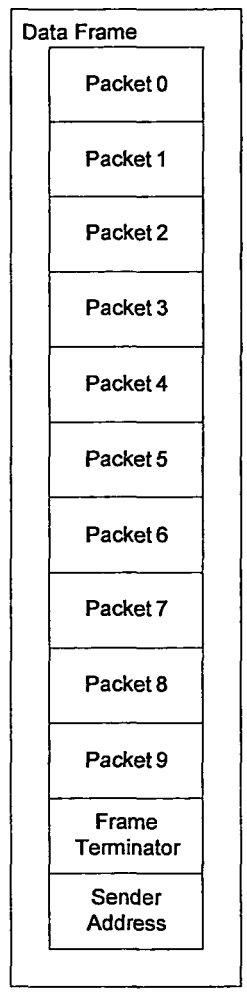
FIG. 7 schematically shows an example of a data frame that can be used to transmit data between monitoring nodes of a monitoring system according to the invention, FIG. 8 schematically shows the electric power transmission system of FIG. 5 with monitoring nodes supplied by local energy generators.

FIG. 7 shows an example of a 123 bytes data frame containing 10 packets (from 0 to 9), each of 12 bytes in length; a frame terminator of 2 bytes in length; and a sender address of 1 bytes in length. The frame terminator indicates the end of a data frame, while the sender address is adapted to contain the address of the current node sending the data frame to a downward node.

Of course, data frames of more or less than 123 bytes may be used.

Each packet can comprise, for example, actual values of the parameters sensed by the sensors of the monitoring node; service information (as information indicating what subset of nodes can insert data into the current data frame; the above mentioned R number, indicating the number of attempts made by the monitoring node for sending the output data to the downward monitoring node; and similar); and data indicative of quality of data/ACK transmissions between nodes.

In a system with more than 10 monitoring nodes, it can be provided that only a subset (comprising at most 10 monitoring nodes) at a time is adapted to put its own output data into a data frame. For example, with 20 monitoring nodes, it can be provided that at a first time, only monitoring nodes 0 to 9 put their own output data into a data frame, nodes 10 to 19 only propagating one another the data frame till the last monitoring node. At a second time, nodes 0 to 9 will only propagate one another the data frame, while node 10 to—besides propagating one another the data frame till the last monitoring node—also put their own output data into the data frame. As disclosed above, the information about what subset of nodes can insert data into the current data frame will be contained in the data frame, as service information. Moreover, each node, at its turn, put its own output data into a corresponding packet of the data frame (e.g., node 0 into packet 0, node 1 into packet 1 and so on).

The central unit 12 and the remote processing station 10 can communicate with each other through a data link at least in part wireless.

For example, communications between the central unit 12 and the remote processing station 10 are in part performed through a GSM/GPRS network 1.

According to a variant (not shown), the data links between the monitoring nodes 100 and/or the data link between the last monitoring node and the central unit 12 and/or the data link between the central unit 12 and the remote processing station 10 can be wired links (either electric or optical).

Figure 6:
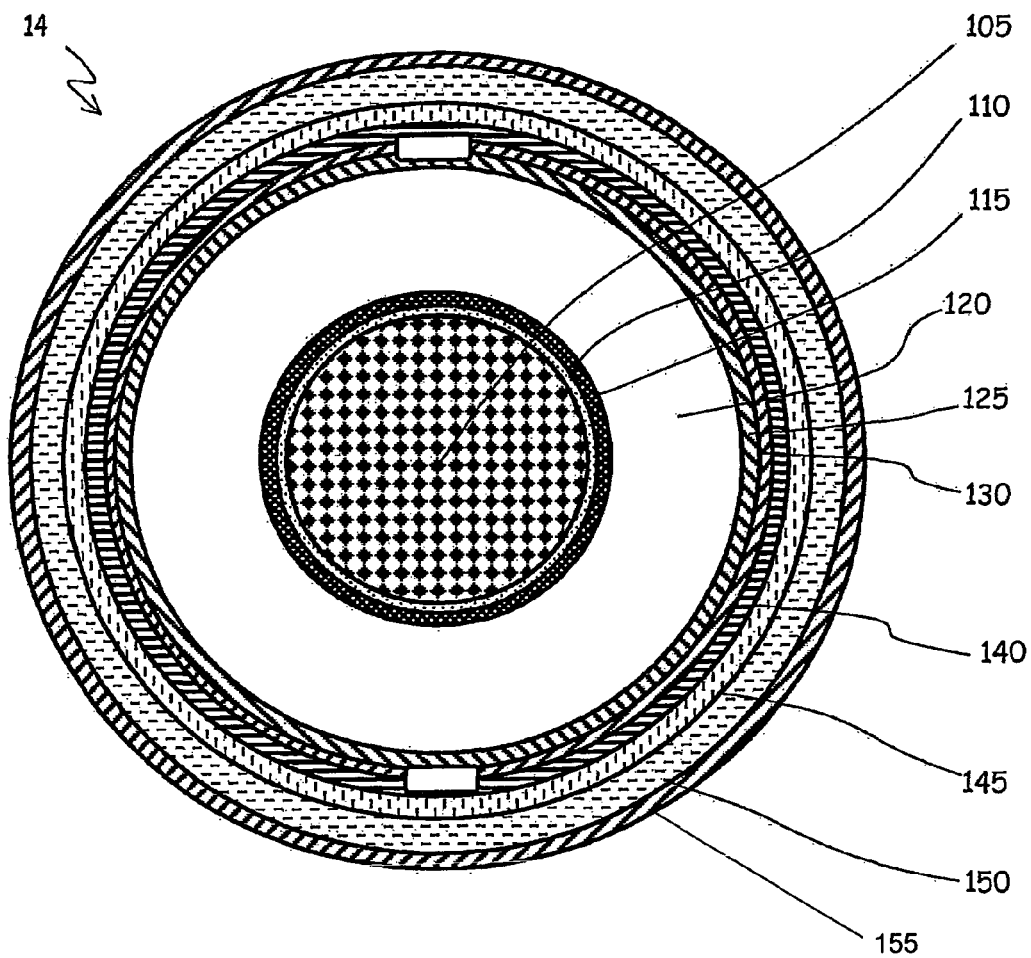
FIG. 6 schematically shows, in cross section, an exemplarily AC cable.

In an embodiment (not shown), the monitoring nodes 100 can communicate data with each other according to a PLC (Power Line Communication) technology, by exploiting the screening layer of the cable (for example the metal screen 145 shown in FIG. 6). In particular, each monitoring node 100 can be provided with an electro-magnetic transceiver comprising a coil. In this way, an alternating current flowing along the coil will produce a magnetic field that induces a varying voltage in the screening layer of the cable. In its turn, an alternating current flowing along the screening layer of the cable will produce a magnetic field that induces a varying voltage in the coil of the electro-magnetic transceiver of the monitoring node.

This embodiment can be particularly useful when RF communications cannot be used as, for example, in case of buried terrestrial cables.

The monitoring system of the invention can be advantageously used for monitoring parameters of at least one cable system of at least one electric power transmission system.

For example, the monitoring system can be advantageously used for assessing the condition of a high voltage insulated cable. For example, this include monitoring the distributed temperature of the cable along its length, in order to be able to decide whether it is possible or not to increase the rating of the cable system or to detect hot spots; monitoring partial discharges on cable, terminals and joints in order to detect the existence and the evolution of partial discharge activity on cable system components that will derive in a breakdown of the insulation; monitoring cable voltages; monitoring screen currents on joint boxes for special current connections in order to detects whether the cable jacket or the joints have experimented some damage that may cause the system to be unsafe; detecting fires in a tunnel; detecting the presence of dangerous gases in manholes or tunnels, and similar.

Figure 5:
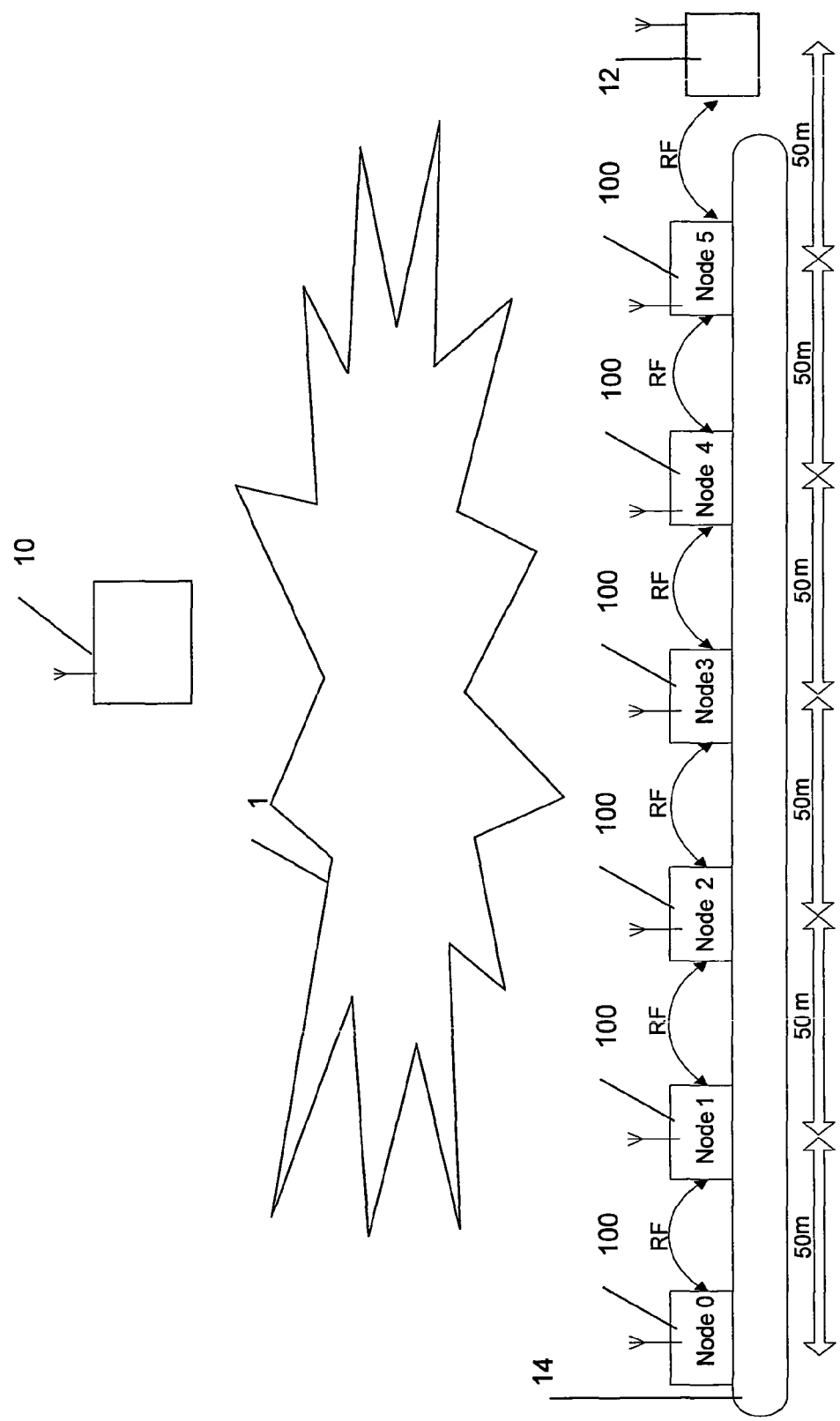
FIG. 5 schematically shows an embodiment of an electric power transmission system comprising the monitoring system of FIG. 1.

FIG. 5 shows the monitoring system of FIG. 1 mounted on an a core 14 of a cable of a cable system, wherein the monitoring nodes 100 are placed at different monitoring points of the core 14.

According to an embodiment, the cable is a terrestrial cable and the core 14 comprises an individually insulated and sheathed electric conductor. In order to enable the use of RF data links between the monitoring nodes 100, the terrestrial cable is advantageously positioned in tunnels.

FIG. 6 shows, in cross section, an exemplarily high voltage AC cable comprising a core 14 with an individually insulated and sheathed electric conductor.

In the example, the core 14 comprises a central metal conductor 105; a binder 110 made of a semi-conductive tape; a conductor screen 115 made of a semi-conductive polymer; an insulation layer 120 made, for example, of cross-linked polyethylene (XLPE); an insulation screen 125, also made of a semi-conductive polymer; semi-conductive water barriers 130 and 140 made for example of a semi-conductive hygroscopic tape; a screen 145 made of a metal in form of, e.g., tapes and/or wires; a sheath 150 of high-density polyethylene (HDPE); and a protective coating 155, typically semi-conductive.

The monitoring nodes 100 can be fixed onto the protective coating 155.

Even if not shown, the monitoring system of the invention can also exemplarily be mounted on a three-phase cable comprising three cores comprising each an individually insulated and sheathed electric conductor.

In this case, a single cascade of monitoring nodes can advantageously be used to monitor the three cores, with the sensors being suitably fixed on different monitoring points of the three cores.

The monitoring system of the invention can also exemplarily be mounted in a substation (e.g., an urban substation) comprising terminal parts of a plurality of cables belonging to a same or different electric power transmission systems (wherein, for example, each cable cable is a three-phase cable comprising at least three insulated, individually sheathed, electric conductors). In this case, the cascade of monitoring nodes can be mounted in the substation so as to monitor the terminal parts of the plurality of cables. For example, they can be mounted so that each terminal part to be monitored is coupled to at least one of the monitoring nodes of the cascade.

Figure 8:
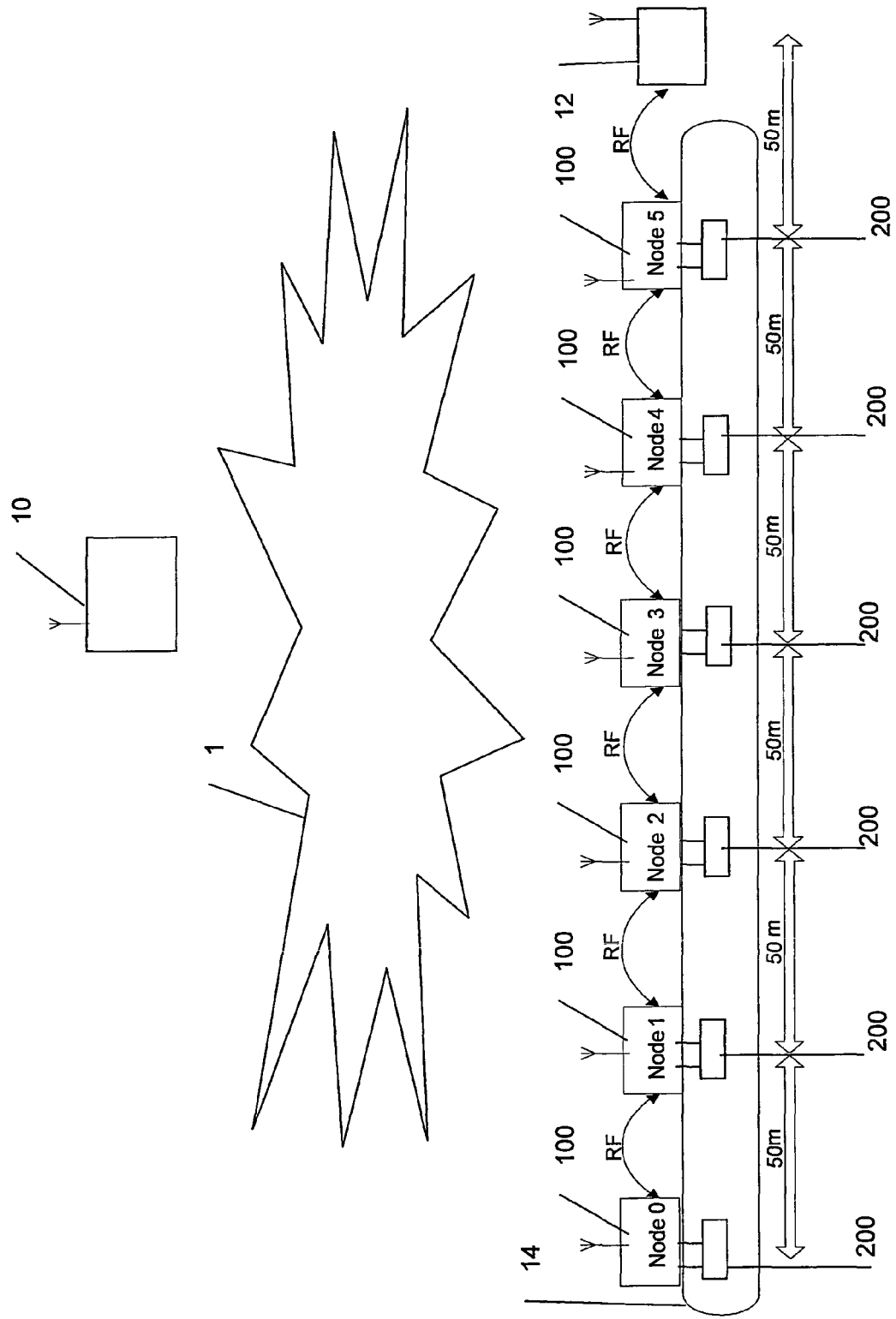

FIG. 8 shows an embodiment of the electric power transmission system of FIG. 5, wherein the monitoring nodes 100 are supplied by local energy generator 200.

In FIG. 8, each local energy generator 200 is electrically connected to a corresponding monitoring node 100.

Even if not shown, the cable of the electric power transmission system of FIG. 8 may also comprise two or more cores (e.g., three cores in a trefoil configuration). In this case, the plurality of apparatuses 200 and the corresponding plurality of monitoring nodes 100 can be fixed on different monitoring points of only one of the plurality of cores, with the sensors of the monitoring nodes 100 suitably placed on different monitoring points of all the cores.

Figure 9:
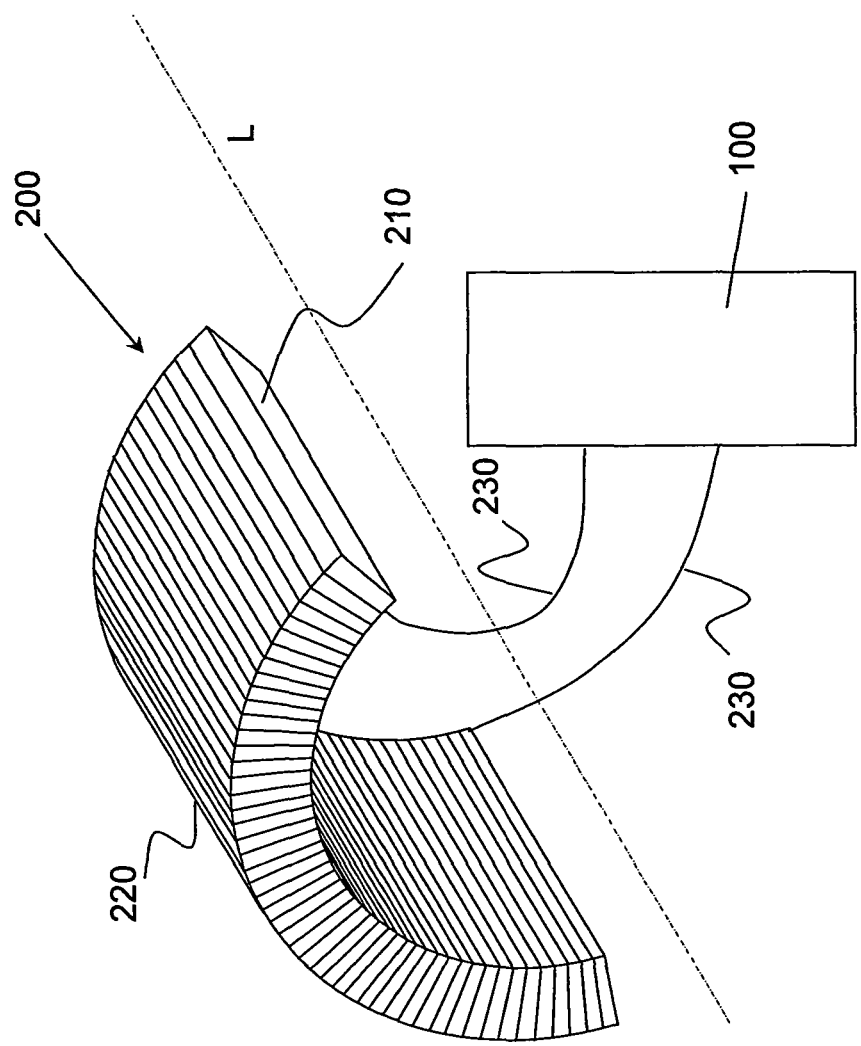
FIG. 9 schematically shows an embodiment of a local energy generator that can be used in the electric power transmission system of FIG. 8.

FIG. 9 schematically shows an embodiment of a local energy generator that can be used to supply a monitoring node 100.

The local energy generator of FIG. 9 comprises an apparatus 200 for generating electric energy comprising an arc shaped ferromagnetic body 210 extending along a longitudinal axis L and an electric winding 220, which is wound around the body 210 to form turns in radial planes, substantially perpendicular to the arc.

Even in FIG. 9 only one electric winding 220 is shown, the apparatus may also comprise more than one winding suitably connected in series or in parallel, depending on the needs.

Moreover, even if in the embodiment shown in FIG. 9 the electric winding 220 is wound around the ferromagnetic body in a single layer of turns, the electric winding 220 can be wound around the ferromagnetic body so as to form more than one layer of turns, one above the other.

Figure 10:
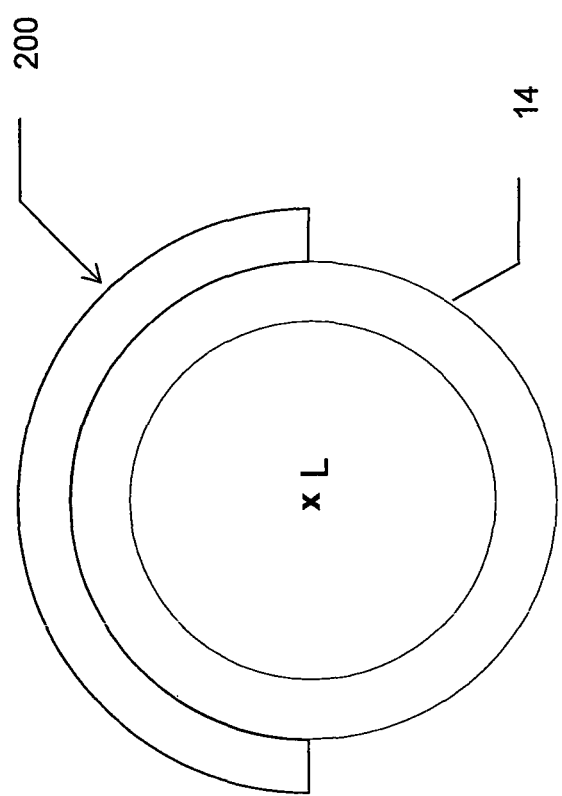
FIG. 10 schematically shows, in cross section, the local energy generator of FIG. 9 fixed upon a single core cable.

FIG. 10 schematically shows, in cross section, a cable system comprising an AC cable comprising a single core 14 and the apparatus 200, wherein the apparatus 200 is fixed upon the single core 14, so as to surround a longitudinal portion of an external surface of the core 14 for part of the angular extension of the core about its longitudinal axis. As shown in FIG. 10, the apparatus 200 is fixed upon the core 14 so that its longitudinal axis L is substantially coincident with the longitudinal axis of the core 14.

The ferromagnetic body 210 advantageously has a cross section of shape and size such as to fit the profile of the external surface of the core 14. Gaps of some mms between the internal surface of the apparatus 200 and the external surface of the core 14 are tolerated.

The apparatus 200 can be fixed upon the core 14 by a suitable binder, a suitable strap or, when it surrounds the core 14 for an angular extension higher than 180°, by elastic clamping.

The core 14 advantageously comprises a high voltage individually insulated and sheathed electric conductor.

Figure 11:
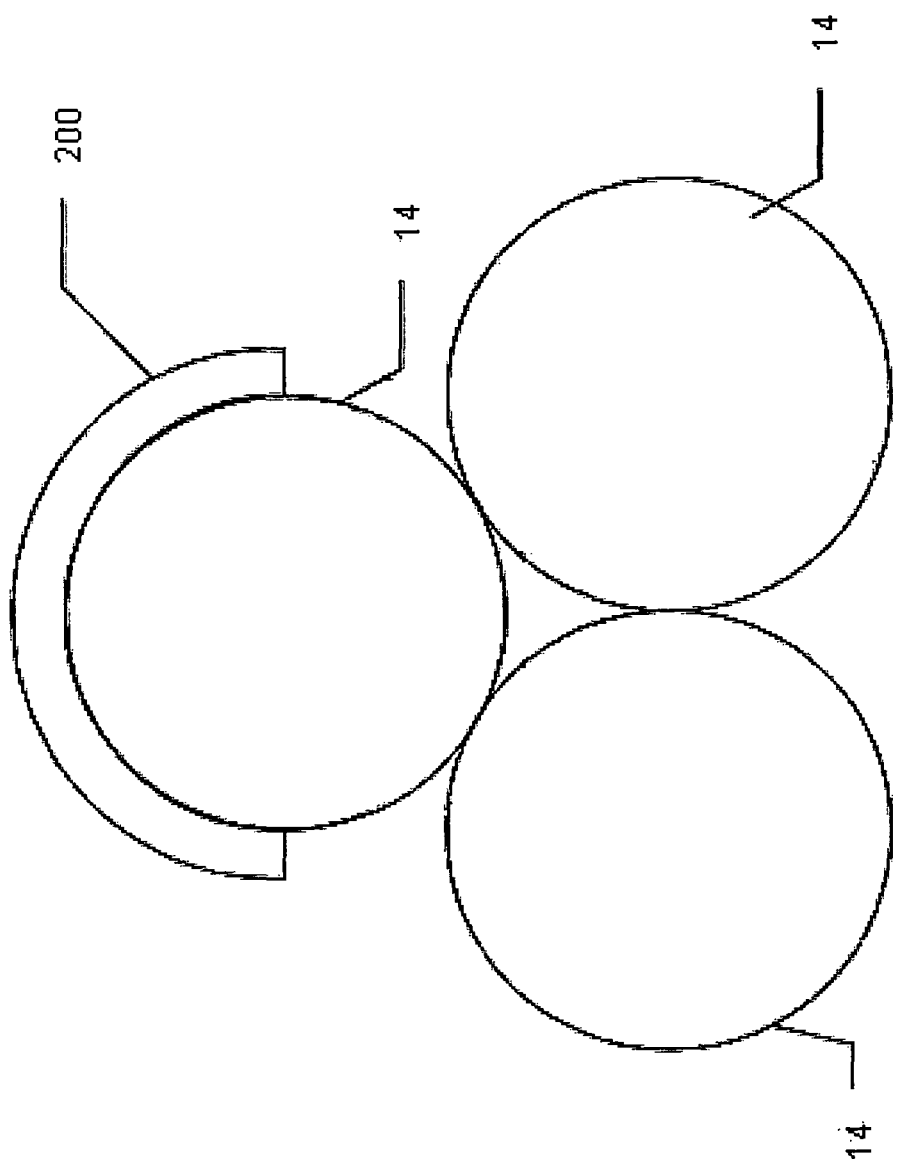
FIG. 11 schematically shows, in cross section, the local energy generator of FIG. 9 fixed upon a core, which is part of a three-phase cable in a trefoil configuration.
Figure 12:
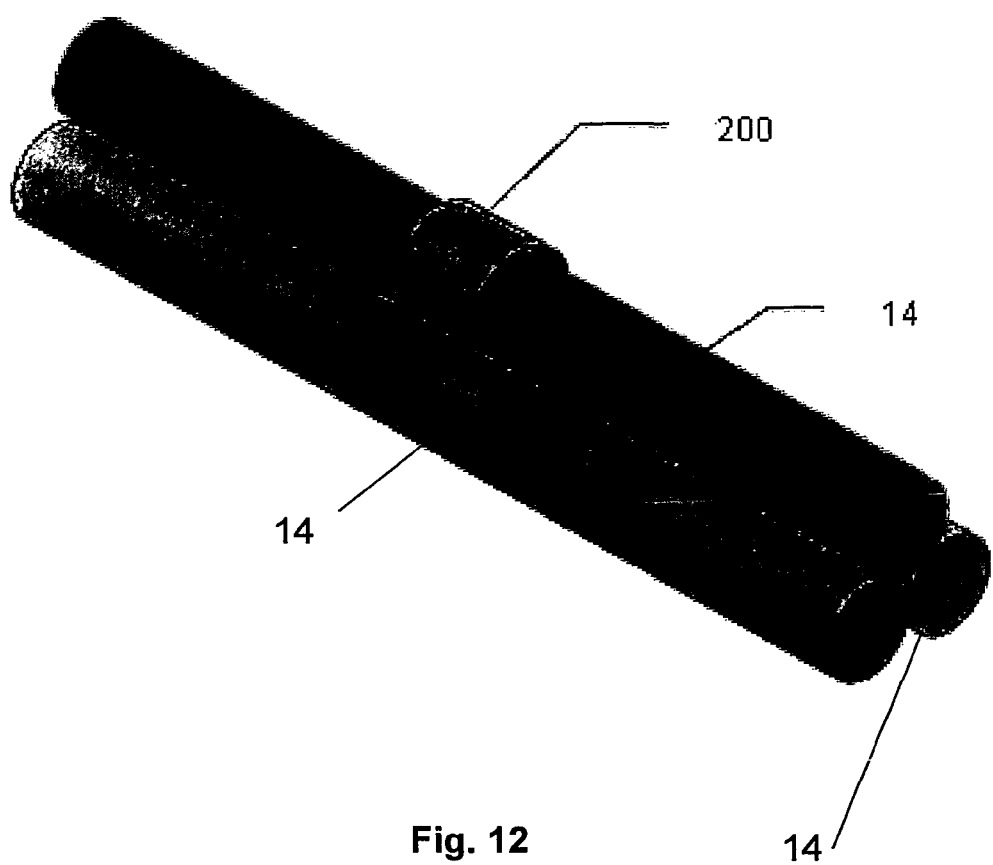
FIG. 12 schematically shows, in a perspective view, the local energy generator of FIG. 11.

In the embodiment shown in FIGS. 10-12, the ferromagnetic body 210 exemplarily has a semi-cylindrical shape.

FIGS. 11 and 12 schematically shows the apparatus 200 fixed upon a core 14, which is part of a trefoil cable configuration.

In the embodiment shown in FIGS. 11 and 12, the trefoil cable configuration comprises three cores 14 comprising each an individually insulated and sheathed electric conductor. Moreover, the apparatus 200 is fixed on only one of the three cores 14.

In the apparatus 200, electric energy is generated by collecting (through the ferromagnetic body 210) the magnetic field generated by an alternating current that flows along the core 14 and transforming it (through the winding 220) into a voltage difference at two electric terminations 230 of the winding 220.

The Applicant made experiments and numerical simulations in order to test electric energy generation in such an apparatus.

Figure 13A:
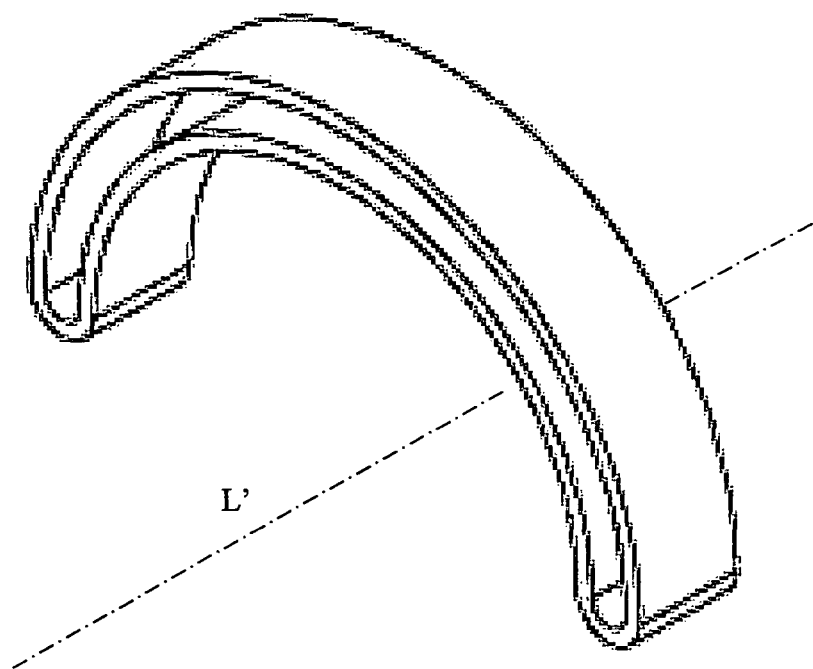
FIGS. 13a and 13b schematically respectively show a perspective view and a cross sectional view of a closed ring ferromagnetic body folded up on itself, which has been tested by the Applicant.
Figure 13B:
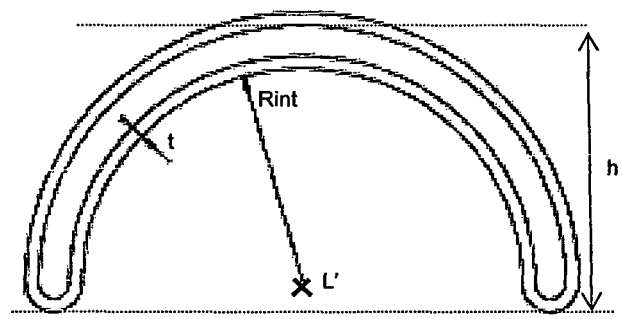

The Applicant started with a closed ring ferromagnetic body in a configuration folded up on itself as shown in FIGS. 13a and 13b. Indeed this configuration is suitable to be fixed upon one of at least two insulated and individually sheathed electric conductors, laid down with at least part of their outer surface adjacent to or in contact with each other.

The closed ring ferromagnetic body was 20 mm in length (along the longitudinal axis L') by 3 mm in thickness (t), had an internal radius (Rint) of 47.5 mm and a height (h) of 69.5 mm.

The ferromagnetic body was made of Magnifer®50 by the company ThyssenKrupp VDM GmbH, which is a nickel-iron alloy with a quantity of nickel of about 48%.

Moreover, the experiments have been carried out by fixing the apparatus upon an insulated sheathed single core cable by Prysmian Cables y Sistemas S.L. of the type 1*1200 Al+H 141 Cu 76/138 kV ENDESA KNE-001.

The external part of the ferromagnetic body (that one which was not directly in contact with the external surface of the cable) was wound by a winding made of enamelled copper wire of 0.62 mm in external diameter.

The apparatus wrapped up the cable for at least 50% of its perimeter.

The tables below show the results experimentally obtained by varying the values of the current flowing along the cable ($I_{cable}$, first column) and the number of winding turns. The voltage, current and power measurements (second, third and fourth column) have been made at the two electric terminations of the winding without and with a 270 Ohms resistor connected thereto.

TABLE 1

(number of turns = 3000, open circuit without resistor)

| $I_{cable}$ [A] | V[V] |
|---|---|
| 104 | 4.3 |
| 209 | 8.4 |
| 299 | 11.6 |
| 404 | 15.29 |
| 498 | 18.2 |
| 601 | 20.78 |

TABLE 2

(number of turns = 1000, open circuit without resistor)

| $I_{cable}$ [A] | V[V] |
|---|---|
| 102 | 1.43 |
| 211 | 2.82 |
| 299 | 3.87 |
| 405 | 5.15 |
| 505 | 6.18 |
| 606 | 7.01 |
| 710 | 7.74 |

TABLE 3

(number of turns = 1000, with a 270 Ohms resistor)

| $I_{cable}$ [A] | V[V] | I[mA] | Power [mW] |
|---|---|---|---|
| 100 | 0.34 | 1.3 | 0.4 |
| 210 | 0.976 | 3.6 | 3.5 |
| 297 | 2.28 | 8.,4 | 19.3 |
| 405 | 4.55 | 16.9 | 76.7 |
| 507 | 6.33 | 23.4 | 148.4 |
| 608 | 7.56 | 28.0 | 211.7 |
| 709 | 8.51 | 31.5 | 268.2 |

TABLE 4

(number of turns = 2000, with a 270 Ohms resistor)

| $I_{cable}$ [A] | V[V] | I[mA] | Power [mW] |
|---|---|---|---|
| 108 | 0.208 | 0.8 | 0.2 |
| 195 | 0.517 | 1.9 | 1.0 |
| 297 | 1.72 | 6.4 | 11.0 |
| 406 | 5 | 18.5 | 92.6 |
| 510 | 9 | 33.3 | 300.0 |
| 596 | 12.02 | 44.5 | 535.1 |
| 697 | 14.03 | 52.0 | 729.0 |

TABLE 5

(number of turns = 3000, with a 270 Ohms resistor)

| $I_{cable}$ [A] | V[V] | I[mA] | Power [mW] |
|---|---|---|---|
| 100 | 0.13 | 0.5 | 0.1 |
| 203 | 0.39 | 1.4 | 0.6 |
| 304 | 1.13 | 4.2 | 4.7 |
| 402 | 3.75 | 13.9 | 52.1 |
| 501 | 7.31 | 27.1 | 197.9 |
| 603 | 11.08 | 41.0 | 454.7 |
| 712 | 15.05 | 55.7 | 838.9 |

It is noted that the intensity of the current flowing along a cable of an electric power transmission system may vary from low to high values (e.g., from 0-150 A to 1000-2000 A) between day and night, between various seasons of the year, between working days and non-working days, and similar. It is thus desirable that—depending on the uses—enough energy generation is guaranteed also at reasonably low currents (e.g., 100-150 A). In the above tests, at low cable currents (e.g., 100-150 A), power levels lower than 1 mW were obtained.

The Applicant then tested an arc shaped ferromagnetic body, in particular a semi-cylindrical ferromagnetic body, having higher length and thickness values than the closed ring body previously tested.

In particular, the experiments were carried out with an apparatus having a semi-cylindrical ferromagnetic body and a winding of enamelled copper wire of 0.62 mm in external diameter. The ferromagnetic body was 100 mm in length, 10 mm in thickness and has an internal bending radius of 51.01 mm. The ferromagnetic body was made of M400-50 soft iron.

Moreover, the experiments have been carried out by fixing the apparatus upon an insulated sheathed single core cable by Prysmian Cables y Sistemas S.L. of the type 1*1200 Al+H 141 Cu 76/138 kV ENDESA KNE-001 (the same of the previous tests).

The following tables show the power levels (second column) experimentally obtained by varying the values of the current flowing along the cable ($I_{cable}$, first column), for different ferromagnetic body lengths and winding turns. The power measurements have been made with a 47 Ohms resistor connected to the two electric terminations of the winding.

TABLE 6

(ferromagnetic body length of 10 cm, number of turns = 600)

| $I_{cable}$ [A] | Power [mW] |
|---|---|
| 90 | 38.777 |
| 100 | 45.977 |
| 150 | 102.045 |
| 200 | 191.489 |
| 250 | 291.277 |
| 300 | 393.404 |
| 350 | 553.404 |
| 400 | 765.957 |

TABLE 7

(ferromagnetic body length of 12 cm, number of turns = 550)

| $I_{cable}$ [A] | Power [mW] |
|---|---|
| 90 | 17.619 |
| 100 | 26.215 |
| 150 | 53.789 |
| 200 | 96.530 |
| 250 | 146.051 |
| 300 | 216.513 |
| 350 | 285.013 |
| 400 | 375.319 |

The Applicant also made experiments with an insulated sheathed single core cable and an apparatus having an arc shaped ferromagnetic body and a winding having the same characteristics as disclosed above with reference to table 6, with the only difference that the ferromagnetic body had an arc shaped cross section extending for an angle of about 270°.

The following table shows the power levels experimentally obtained by varying the values of the current flowing along the cable ($I_{cable}$, first column), for the semi-cylindrical ferromagnetic body of table 6, with arc shaped cross section extending for 180° (second column), and for the ferromagnetic body with arc shaped cross section extending for 270° (third column). The measurements have been made putting the two electric terminations of the winding in short circuit. In order to calculate the power generated by the apparatus, the internal resistance of the winding was taken in account. In this case, for a 600 turns winding, an internal resistance of 14 Ohms was taken in account.

TABLE 8

| $I_{cable}$ [A] | Power [mW]—180° | Power [mW]—270° |
|---|---|---|
| 95.2 | 26.523 | 123.704 |
| 299.2 | 410.027 | 1251.614 |
| 584 | 1583.720 | 4840.416 |
| 1002 | 4785.149 | 15084.216 |

The experimental results of the above tables 6-8 surprisingly showed that an arc shaped ferromagnetic body enables power levels higher than 26 mW to be obtained for reasonably low cable currents (e.g., about 100-150 A). In particular, power levels of from about 100 to 1250 mW were obtained for cable currents of about 95-300 A with the ferromagnetic body having an arc shaped cross section extending for 270°.

Power levels of 100-200 mW can be of practical utility for supplying a monitoring node of the monitoring system according to the invention.

The above tables 6 and 7 further show that better power levels were obtained for a ferromagnetic body length of 10 cm and for a number of turns of 600.

Moreover, table 8 shows that the power levels obtained with the ferromagnetic body having an arc shaped cross section extending for 270° are 3-5 times larger than the power levels obtained with the semi-cylindrical ferromagnetic body (with arc shaped cross section extending for)180°.

The Applicant made further experiments and numerical simulations that showed that an arc shaped ferromagnetic body can be made of any ferromagnetic material without significantly affecting the efficiency of the apparatus.

This is advantageous because it allow using low cost ferromagnetic materials.

Moreover, the use of an arc shaped ferromagnetic body allows reducing the quantity of material used to make the apparatus and, thus, production cost with respect to a closed ring body.

In general, the experiments and numerical simulations carried out by the Applicant surprisingly showed that even though:

for an arc shaped ferromagnetic body, which surrounds the core of an AC cable for only part of its angular extension about its longitudinal axis, the magnetic field collection efficiency is lower than for a closed ring ferromagnetic body, which surrounds the core for the whole of its angular extension; and even though outside an insulated sheathed conductor—due to the insulation layer(s) and to the protective layer(s)—the magnetic field produced by the alternating current (AC) flowing along the electric conductor is much weaker than outside an aerial bare conductor, power values of practical utility (e.g., higher than 100-200 mW) can still be obtained by the apparatus for generating electric energy, when put on an insulated sheathed conductor.

The invention claimed is:

1. A monitoring system for monitoring parameters of a cable system of an electric power transmission system, comprising a central unit and a plurality of monitoring nodes adapted to be placed at different monitoring points of the cable system, wherein:

each monitoring node is adapted to alternatively operate in sleeping mode and in active mode, and during sleeping mode each monitoring node is adapted to be idle with no reception, transmission, or acquisition of data, and during active mode each monitoring node is adapted to acquire a value of at least one of said parameters and to process the acquired value so as to generate corresponding output data; and the central unit is adapted to collect the output data corning from the monitoring nodes;

wherein the monitoring nodes are connected in cascade and, during active mode, each monitoring node is adapted:

to receive output data from an upward node of the cascade, if any; and to send to a downward node, if any, the output data received from said upward node and the output data generated by the monitoring node, a last monitoring node of the cascade adapted to send said output data to the central unit; and wherein the monitoring nodes are adapted to operate alternatively in sleeping mode and in active mode with a period T according to synchronized time frames, wherein T is the time between the beginning of two consecutive active modes, wherein the time synchronized in such a way that each monitoring node, starts to operate in each active mode before the upward monitoring node starts sending the output data thereto.

2. The monitoring system according to claim 1, wherein the time frames are synchronized in such a way that the monitoring nodes pass from each sleeping mode to each active mode in sequence, one after the other.

3. The monitoring system according to claim 1, wherein the time frames are synchronized in such a way that each monitoring node starts to operate in each active mode right before the upward monitoring node starts sending the output data thereto.

4. The monitoring system according to claim 1, wherein the time frames are synchronized so as to minimize the waiting time for receiving output data from an upward monitoring node.

5. The monitoring system according to claim 1, wherein the monitoring nodes are connected to each other in cascade through a plurality of data links.

6. The monitoring system according to claim 5, wherein the data links are wireless.

7. The monitoring system according to claim 6, wherein the wireless data links are radio frequency data links.

8. The monitoring system according to claim 1, wherein the central unit is adapted to operate alternatively in sleeping mode and in active mode, with a time frame synchronized with the time frame of the last monitoring node of the cascade.

9. The monitoring system according to claim 1, wherein the monitoring nodes are supplied by local energy generators.

10. The monitoring system according to claim 1, wherein the monitoring nodes each comprise at least one sensor.

11. An electric power transmission system comprising a cable system and a monitoring system for monitoring parameters of the cable system, the monitoring system comprising a central unit and a plurality of monitoring nodes placed at different monitoring points of the cable system, wherein:
  each monitoring node is adapted to alternatively operate in sleeping mode and in active mode, and during sleeping mode each monitoring node is adapted to be idle with no reception, transmission, or acquisition of data, and during active mode each monitoring node is adapted to acquire a value of at least one of said parameters and to process the acquired value so as to generate corresponding output data; and
  the central unit is adapted to collect the output data coming from the monitoring nodes;
  wherein the monitoring nodes are connected in cascade and, during active mode, each monitoring node is adapted:
    to receive output data from an upward node of the cascade, if any; and
    to send to a downward node, if any, the output data received from said upward node and the output data generated by the monitoring node, a last monitoring node of the cascade adapted to send said output data to the central unit; and
  wherein the monitoring nodes are adapted to operate alternatively in sleeping mode and in active mode with a period T according to synchronized time frames, wherein T is the time between the beginning of two consecutive active modes,
  wherein the time frames are synchronized in such a way that each monitoring node starts to operate in each active mode before the upward monitoring node starts sending the output data thereto.

12. The electric power transmission system of claim 11, further comprising a plurality of local energy generators for supplying the plurality of monitoring nodes.

13. A method of monitoring parameters of a cable system of an electric power transmission system, comprising:
  associating a plurality of monitoring nodes with different monitoring points of the cable system;
  operating the monitoring nodes alternatively in sleeping mode and in active mode, wherein in sleeping mode, the monitoring nodes are idle with no reception, transmission, or acquisition of data, and in active mode, the monitoring nodes acquire values of at least one of said parameters and process the acquired values so as to generate corresponding output data; and
  collecting the output data generated by the monitoring nodes in a central unit;
  wherein the output data generated by the monitoring nodes are sent from the monitoring nodes, when in active mode, toward the central unit by making the output data pass from one of the monitoring nodes to another, by starting from the monitoring node that generates the output data until a last of the monitoring nodes, which forwards the output data to the central unit; and
  wherein the monitoring nodes operate alternatively in sleeping mode and in active mode with a period T according to synchronized time frames, wherein T is the time between the beginning of two consecutive active modes,
  wherein the time frames are synchronize in such a way that each monitoring node starts to operate in each active mode before the upward monitoring node starts sending the output data thereto.

* * * * *